United States Patent
Cai et al.

(10) Patent No.: US 10,481,215 B2
(45) Date of Patent: Nov. 19, 2019

(54) METHOD AND APPARATUS FOR EVALUATING A BATTERY CELL

(71) Applicant: GM GLOBAL TECHNOLOGY OPERATIONS LLC, Detroit, MI (US)

(72) Inventors: Wayne Cai, Troy, MI (US); Debejyo Chakraborty, Novi, MI (US); Teresa J. Rinker, Royal Oak, MI (US); Megan E. McGovern, Royal Oak, MI (US); Ryan C. Sekol, Grosse Pointe Woods, MI (US); Diana M. Wegner, Broomfiled Hills, MI (US); Kevin B. Rober, Washinghton, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 226 days.

(21) Appl. No.: 15/692,766

(22) Filed: Aug. 31, 2017

(65) Prior Publication Data
US 2019/0064277 A1  Feb. 28, 2019

(51) Int. Cl.
| G01R 31/389 | (2019.01) |
| G01R 31/385 | (2019.01) |
| G01R 31/382 | (2019.01) |
| H01M 2/02 | (2006.01) |
| H01M 10/42 | (2006.01) |
| H01M 10/48 | (2006.01) |

(52) U.S. Cl.
CPC ......... *G01R 31/389* (2019.01); *G01R 31/382* (2019.01); *G01R 31/385* (2019.01); *H01M 2/021* (2013.01); *H01M 10/4285* (2013.01); *H01M 10/48* (2013.01)

(58) Field of Classification Search
CPC .. G01R 31/385; G01R 31/389; G01R 31/382; G01R 31/3662
See application file for complete search history.

(56) References Cited

U.S. PATENT DOCUMENTS

| 5,231,356 | A  | * | 7/1993 | Parker | G01D 7/005 324/435 |
| 2004/0155626 | A1 | * | 8/2004 | Hedegor | B07C 5/344 320/116 |
| 2013/0147463 | A1 | * | 6/2013 | Takase | G01R 19/0092 324/117 R |
| 2017/0059663 | A1 | * | 3/2017 | Ishikawa | H01M 8/04552 |
| 2019/0237822 | A1 | * | 8/2019 | Rober | G01N 27/301 |

* cited by examiner

*Primary Examiner* — Matthew J Merkling
(74) *Attorney, Agent, or Firm* — Reising Ethington P.C.

(57) ABSTRACT

A method and an apparatus for evaluating a battery cell. The battery cell may include a hermetically sealed outer casing, a plurality of electrically conductive components enclosed within the outer casing, an electrically conductive terminal having a proximal end that extends within the outer casing and a distal end that extends in a longitudinal direction relative to the battery cell outside the outer casing, and a solid electrical and mechanical joint formed between one or more of the electrically conductive components and the proximal end of the electrically conductive terminal. Evaluation of the battery cell may include measuring the impedance of the battery cell while applying a longitudinal pulling force or a transverse bending force to the electrically conductive terminal and the solid electrical and mechanical joint.

14 Claims, 6 Drawing Sheets

METHOD AND APPARATUS FOR EVALUATING A BATTERY CELL

TECHNICAL FIELD

The present disclosure relates generally to electrochemical cells and, more specifically, to packages of electrically interconnected electrochemical cells.

INTRODUCTION

A battery is a device that converts chemical energy into electrical energy by means of electrochemical reduction-oxidation (redox) reactions. In secondary or rechargeable batteries, these electrochemical reactions are reversible, which allows the batteries to undergo multiple charging and discharge cycles.

Secondary lithium ion batteries include electrochemical cells that include a negative electrode, a positive electrode, and an electrolyte for conducting lithium ions between the negative and positive electrodes. A porous separator wetted with a liquid electrolyte solution is sandwiched between the electrodes to physically separate and electrically insulate the electrodes from each other while permitting free ion flow. Each of the negative and positive electrodes is typically carried on or connected to a metallic current collector. The current collectors are connected to each other by an interruptible external circuit through which electrons can pass from one electrode to the other while lithium ions migrate in the opposite direction through the electrochemical cell during charging and discharge of the battery.

In a pouch-type lithium ion battery cell, each current collector comprises a flat metallic sheet having opposed major faces coated with a layer of either positive or negative electrode material and an uncoated tab extending therefrom. Multiple negative electrode material-coated current collectors and multiple positive electrode material-coated current collectors are alternatively stacked one on top of one another with coextensive porous separator layers disposed therebetween. The uncoated tabs associated with each of the negative electrode material-coated current collectors are gathered together and attached to one another and to a negative electrode terminal by a solid joint. Likewise, the uncoated tabs associated with each of the positive electrode material-coated current collectors are gathered together and attached to one another and to a positive electrode terminal by a solid joint. Thereafter, the stack of coated current collectors and porous separator layers is sealed within a flexible container or pouch, such that only distal ends of the negative and positive electrode terminals extend therefrom. The uncoated tabs of the current collectors and the solid joints formed therebetween are entirely sealed within the pouch. The distal ends of the negative and positive electrode terminals may be electrically connected in parallel or in series to one or more other battery cells to form a battery module, which in turn may be electrically connected in series or in parallel to one or more other battery modules to form a battery pack.

SUMMARY

A method of evaluating a battery cell. The battery cell may include a hermetically sealed outer casing, a plurality of positive and negative electrode layers enclosed within the outer casing, and an electrically conductive terminal having a proximal end that extends within the outer casing and a distal end that extends outside the outer casing. A solid electrical and mechanical joint may be formed between either the positive or negative electrode layers and the proximal end of the electrically conductive terminal. The solid electrical and mechanical joint may be entirely enclosed within the outer casing of the battery cell. An electrical connection may be established between the distal end of the electrically conductive terminal and a battery cell impedance measuring device. The method may include applying a longitudinal pulling force or a transverse bending force to the electrically conductive terminal and the solid electrical and mechanical joint while the impedance of the battery cell is measured.

The longitudinal pulling force or the transverse bending force may be applied to the electrically conductive terminal and the solid electrical and mechanical joint without applying a compressive force to the outer casing of the battery cell.

A longitudinal pulling force may be applied to the electrically conductive terminal of the battery cell and the solid electrical and mechanical joint enclosed within the outer casing of the battery cell by applying a centrifugal force to the battery cell.

A transverse bending force may be applied to the electrically conductive terminal and the solid electrical and mechanical joint of the battery cell by holding the distal end of the electrically conductive terminal in a stationary position and moving at least a portion of the outer casing of the battery cell in a transverse direction.

A transverse bending force may be applied to the electrically conductive terminal and the solid electrical and mechanical joint of the battery cell by holding at least a portion of the outer casing of the battery cell in a stationary position and moving the electrically conductive terminal in a transverse direction.

Battery cell impedance measurements taken during application of a longitudinal pulling force or a transverse bending force to the electrically conductive terminal and the solid electrical and mechanical joint of the battery cell may be evaluated to for the purpose of assessing the integrity of the solid electrical and mechanical joint without adversely impacting battery cell functionality.

Non-destructive measurements may be performed on the battery cell prior to, during, or after the longitudinal pulling force or the transverse bending force is applied to the electrically conductive terminal and the solid electrical and mechanical joint for the purpose of assessing the integrity of the solid electrical and mechanical joint. The non-destructive measurements may comprise at least one of the following techniques: laser imaging, laser shearography, laser ultrasonic testing, optical imaging, acoustic emission testing, thermography, 3D laser scanning, optical coherence tomography, and combinations thereof.

An apparatus for evaluating a battery cell, in accordance with one aspect of the present disclosure. The battery cell may include a hermetically sealed outer casing, a plurality of electrically conductive components enclosed within the outer casing, and an electrically conductive terminal having a proximal end that extends within the outer casing and a distal end that extends in a longitudinal direction relative to the battery cell outside the outer casing. A solid electrical and mechanical joint may be formed between one or more of the electrically conductive components and the proximal end of the electrically conductive terminal. The solid electrical and mechanical joint may be entirely enclosed within the outer casing of the battery cell.

The apparatus may comprise a circular platform supported for rotation about a central axis and a plurality of slots circumferentially spaced apart from one another on the circular platform. Each of the slots may include a first end oriented toward the central axis of the circular platform and an opposite second end oriented away from the central axis toward an outer circumference of the platform. A terminal clamp may be located adjacent the first end of one of the slots for securing the battery cell within the slot. The battery cell may be secured within the slot by the terminal clamp such that movement of the distal end of the electrically conductive terminal is restrained. The distal end of the electrically conductive terminal may extend from a first end of the outer casing, and movement of an opposite second end of the outer casing may be unrestrained in the longitudinal direction. During rotation of the circular platform, the electrically conductive terminal and the solid electrical and mechanical joint may experience a pulling force in the longitudinal direction and in a radially outward direction relative to the central axis of the circular platform.

The terminal clamp may be configured to provide an electrical connection between the distal end of the electrically conductive terminal and a battery cell impedance measuring device.

Movement of the battery cell within the slot may be constrained in a lateral direction relative to the battery cell by a pair of longitudinally extending sidewalls.

The circular platform may include a plurality of discrete circumferentially spaced-apart radially extending segments. The plurality of slots may be distributed among the radially extending segments of the circular platform. The radially extending segments of the circular platform may be configured to pivot relative to a pivot axis to impart a transverse bending force to the electrically conductive terminals of the battery cells secured within the slots of the radially extending segments.

A plurality of rollers may be disposed within the slots for physically supporting the battery cells within the slots without inhibiting radially outward movement of the battery cells during rotation of the circular platform.

The battery cell may include a first end having a first electrically conductive terminal extending therefrom and an opposite second end having a second electrically conductive terminal extending therefrom. In such case, the terminal clamp may be configured to retain the battery cell within one of the slots such that the first electrically conductive terminal is oriented toward the central axis of the circular platform and the second electrically conductive terminal is oriented away from the central axis.

A weight may be coupled to the outer casing of the battery cell defined by the second end of the battery cell or to the second electrically conductive terminal of the battery cell.

In one form, the battery cell may comprise a lithium ion battery cell.

An apparatus for evaluating a battery cell, in accordance with another aspect of the present disclosure. The battery cell may include a hermetically sealed outer casing, a plurality of electrically conductive components enclosed within the outer casing, and an electrically conductive terminal having a proximal end that extends within the outer casing and a distal end that extends in a longitudinal direction relative to the cell outside the outer casing. A solid electrical and mechanical joint may be formed between one or more of the electrically conductive components and the proximal end of the electrically conductive terminal. The solid electrical and mechanical joint may be entirely enclosed within the outer casing of the battery cell.

The apparatus may comprise a battery cell holder defining a chamber in which at least a portion of the outer casing of the battery cell is received, a pair of electrically conductive tangs for establishing an electrical connection between the distal end of the electrically conductive terminal and a battery cell impedance measuring device, and a means for moving the distal end of the electrically conductive terminal relative to the proximal end of the electrically conductive terminal such that a bending force is applied to electrically conductive terminal and the solid electrical and mechanical joint.

In one form, the battery cell holder may be configured to pivot about a pivot axis during operation of the apparatus. In such case, the means for moving the distal end of the electrically conductive terminal relative to the proximal end of the electrically conductive terminal may comprise a clamp. The clamp may hold the distal end of the electrically conductive terminal of the battery cell in a stationary position while the battery cell holder pivots about the pivot axis during operation of the apparatus.

In another form, the battery cell holder may be configured to hold at least a portion of the outer casing of the battery cell in a stationary position during operation of the apparatus. In such case, the means for moving the distal end of the electrically conductive terminal relative to the proximal end of the electrically conductive terminal may comprise a source of pressurized gas. The source of pressurized gas may direct a pulse or a continuous flow of pressurized gas at the electrically conductive terminal such that the distal end of the electrically conductive terminal pivots about a pivot axis during operation of the apparatus.

In yet another form, the battery cell holder may be configured to hold at least a portion of the outer casing of the battery cell in a stationary position during operation of the apparatus. In such case, the means for moving the distal end of the electrically conductive terminal relative to the proximal end of the electrically conductive terminal may comprise an oscillator. The oscillator may include an upper plate and a lower plate having complementary facing surfaces that define a gap therebetween. The gap between the upper and lower plates of the oscillator may be sized to receive the distal end of the electrically conductive terminal and to repeatedly move the distal end of the electrically conductive terminal up and down as the upper and lower plates of the oscillator move in tandem in a lateral direction relative to the at least a portion of the outer casing of the battery cell during operation of the apparatus.

DETAILED DESCRIPTION

Figure 1:
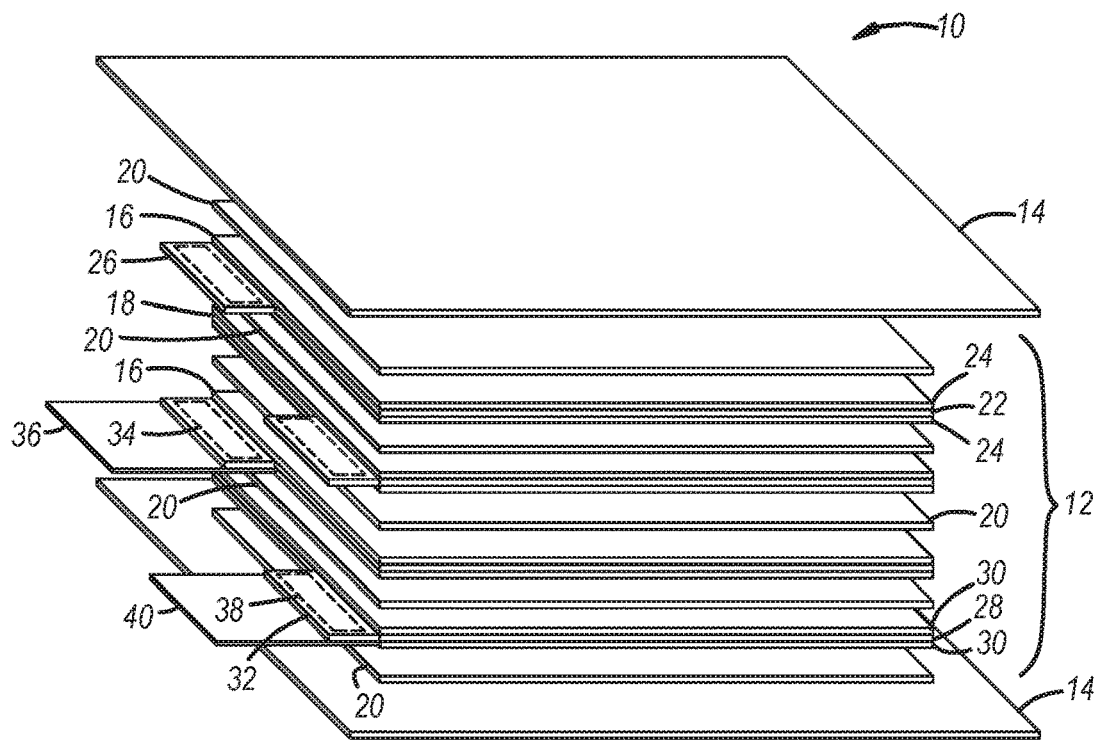
FIGS. 1-2 are exploded perspective views of pouch-type lithium ion battery cells, with each battery cell including a stack of electrochemical cells.
Figure 2:
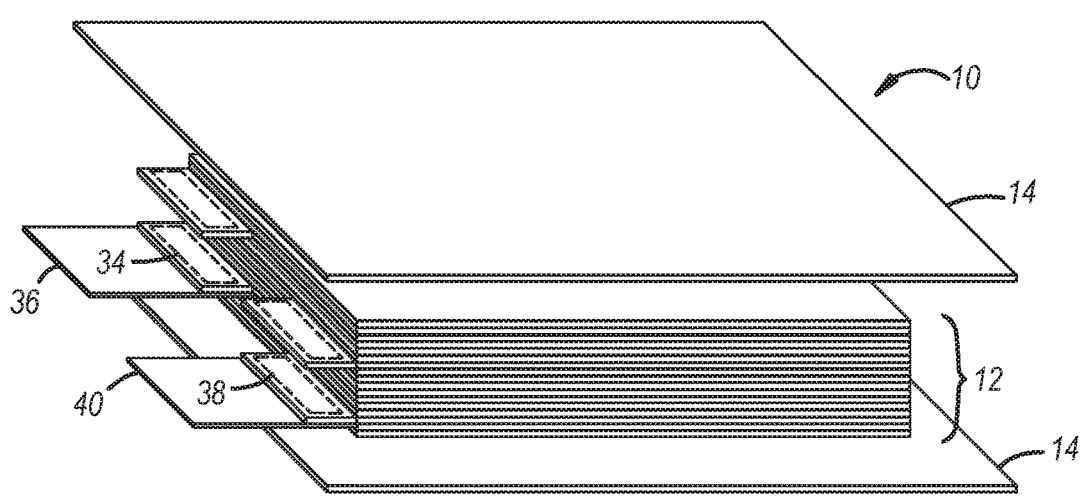

FIGS. 1-2 illustrate in idealized fashion an exploded view of a pouch-type battery cell 10 including a stack 12 of like-shaped electrochemical cell components disposed between a pair of flexible laminated sheets 14, in accordance with one aspect of the present disclosure. In one form, the battery cell 10 may comprise a lithium ion battery cell. The stack 12 of like-shaped electrochemical cell components includes multiple alternating positive electrode layers 16 and negative electrode layers 18 with coextensive porous separator layers 20 interposed therebetween. In the embodiment depicted in FIGS. 1-2, the stack 12 includes two pairs of positive and negative electrode layers 16, 18, three separator layers 20 interposed between the electrode layers 16, 18, and two separator layers 20 interposed between the outermost electrode layers 16, 18 and the laminated sheets 14. In other embodiments, the stack 12 may include more than two pairs of positive and negative electrode layers 16, 18. In one form, the stack 12 may include 15-60 pairs of positive and negative electrode layers 16, 18.

In FIGS. 1-2, the stack 12 includes a plurality of discrete layers 16, 18, 20, although other arrangements are certainly possible. For example, instead of discrete separator layers 20, the positive electrode layers 16 and the negative electrode layers 18 may be separated from one another by winding or interweaving a single continuous separator sheet between the electrode layers 16, 18. In another example, the stack 12 may include continuous and sequentially stacked positive electrode, separator, and negative electrode sheets folded or rolled together to form a "jelly roll." In addition, although the flexible laminated sheets 14 comprise the outermost components of the pouch-type battery cell 10 shown in FIGS. 1-2, the stack 12 alternatively may be enclosed between a single laminated sheet that is folded over upon itself, or the stack 12 may be enclosed within a different type of casing.

Each of the positive electrode layers 16 includes a positive electrode current collector 22 having opposed major faces with layers of positive electrode material 24 formed thereon and an uncoated tab 26 extending therefrom. Likewise, each of the negative electrode layers 18 includes a negative electrode current collector 28 having opposed major faces with layers of negative electrode material 30 formed thereon and an uncoated tab 32 extending therefrom. The current collectors 22, 28 may comprise any metallic material capable of collecting and reversibly passing free electrons to and from their respective electrode material layers 24, 30. For example, the current collectors 22, 28 may comprise thin and flexible metallic sheets or foils. In one form, the positive electrode current collectors 22 may comprise an aluminum foil and the negative electrode current collectors 28 may comprise a copper foil.

The porous separator layers 20 may comprise any material that can physically separate and electrically insulate the electrodes layers 16, 18 from one another while permitting the free flow of ions, e.g., lithium ions, therebetween. The laminated sheets 14 may comprise any material that can be joined together to form a hermetic seal around the stack 12 of electrochemical cell components. For example, each of the laminated sheets 14 may comprise an aluminum foil laminated between one or more polymer layers.

In assembly, the uncoated tabs 26 of the positive electrode current collectors 22 are gathered together at respective locations 34 and attached as a group to a proximal end of a positive terminal 36. Similarly, the uncoated tabs 32 of the negative electrode current collectors 28 are gathered together at respective locations 38 and attached as a group to a proximal end of a negative terminal 40. In one form, the tabs 26, 32 may be ultrasonically welded to their respective terminals 36, 40 to form a metallurgical bond therebetween.

Figure 3:
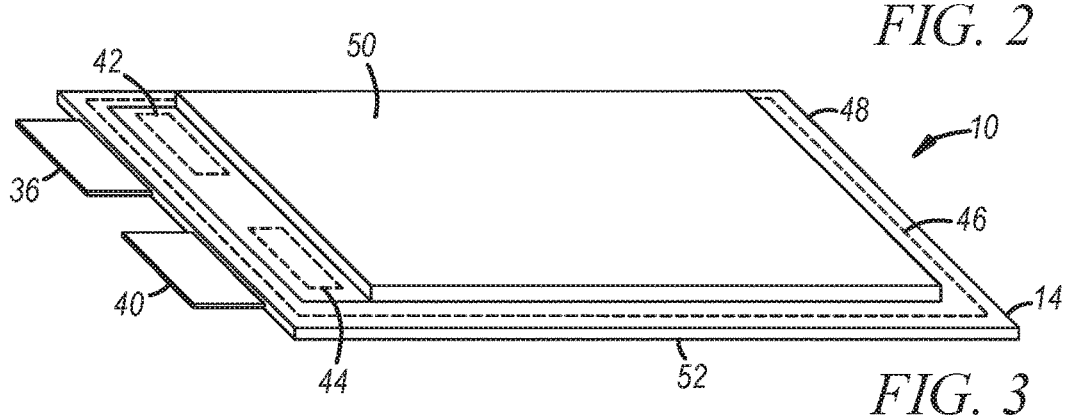
FIG. 3 is a perspective view of an assembled pouch-type lithium ion battery cell including a stack of electrochemical cells hermetically sealed within a pouch.

Referring now to FIG. 3, which illustrates the pouch-type battery cell 10 in assembled form. After a solid joint 42 is formed between the tabs 26 of the positive electrode current collectors 22 and the proximal end of the positive terminal 36 and a solid joint 44 is formed between the tabs 32 of the negative electrode current collectors 28 and the proximal end of the negative terminal 40, the stack 12 is infiltrated with a liquid electrolyte (not shown) and hermetically sealed within an enclosure 46 defined by an outer casing 48. The liquid electrolyte wets the surfaces of the positive and negative electrode layers 16, 18 and the separator layers 20 and may comprise any material that is capable of effectively conducting ions through the separator layers 20 and between the negative and positive electrode layers 16, 18 during operation of the battery cell 10.

The outer casing 48 may be formed by joining together the laminated sheets 14 shown in FIGS. 1 and 2. In one form, the laminated sheets 14 may be joined together to form the outer casing 48 by fusing or heat sealing the sheets 14 together along their edges such that a hermetic seal is formed around a periphery of the enclosure 46 and around a periphery of the stack 12. As shown in FIG. 3, the proximal ends of the positive and negative terminals 36, 40 and the solids joints 42, 44 formed between the terminals 36, 40 and their respective tabs 26, 32 are sealed within the enclosure 46. On the other hand, the distal ends of the positive and negative terminals 36, 40 extend outside of the enclosure 46, beyond a periphery of the outer casing 48. In the embodiment shown in FIG. 3, the distal ends of both of the positive and negative terminals 36, 40 extend in a longitudinal direction from a first end of the outer casing 48. In other embodiments, the distal end of one of the terminals 36, 40 may extend in a longitudinal direction from the first end of the outer casing 48 and the distal end of the other terminal 36, 40 may extend in a longitudinal direction from an opposite second end of the outer casing 48.

After the stack 12 is hermetically sealed within the enclosure 46, the exposed distal ends of the positive and negative terminals 36, 40 may be connected in parallel or in series to the positive and negative terminals of one or more other pouch-type battery cells. For example, battery cell 10 may be electrically connected to one or more other battery cells by welding the positive and negative terminals 36, 40 of the cells to a busbar or like current-carrying connector. Groups of electrically connected battery cells 10 may be assembled as battery modules, with the modules, in turn, being assembled into a battery pack.

In assembly, the battery cell 10 may have a thickness—measured from a major exterior surface on a first side 50 of the outer casing 48 to a major exterior surface on an opposite second side 52 of the outer casing 48—in the range of about 3 to about 20 mm. Individually, the current collectors 22, 28 may have thicknesses of about 20 micrometers, the electrode material layers 24, 30 may have thicknesses of up to 200 micrometers, the separator layers 20 may have thicknesses of about 25 micrometers, and the terminals 34, 38 may have thicknesses of about 200 micrometers.

Prior to incorporating the battery cell 10 into a battery module or battery pack, it may be desirable to assess the integrity of the solid joints 42, 44 sealed within the enclosure 46, without destroying or compromising the functionality of the cell 10. The integrity of the solid joints 42, 44 sealed within the enclosure 46 may be assessed by monitoring the impedance of the cell 10, as measured across the exposed distal ends of the positive and negative terminals 36, 40 of the cell 10. In one form, the impedance of the cell 10 may be measured using electrochemical impedance spectroscopy (EIS). It also may be desirable to assess the integrity of the solid joints 42, 44 sealed within the enclosure 46 by applying a load or force to the positive and negative terminals 36, 40, for example, by pulling the positive and negative terminals 36, 40 in a longitudinal (or length) direction away from the outer casing 48 of the cell 10 and/or by bending the positive and negative terminals 36, 40 in a transverse direction perpendicular to a plane defined by the longitudinal direction and a latitudinal (or width) direction of the outer casing 48 of the cell 10. In addition, it may be desirable to assess the integrity of the solid joints 42, 44 sealed within the enclosure 46 applying a compressive force to the outer casing 48 of the cell 10, such as from a clamp.

Figure 4:
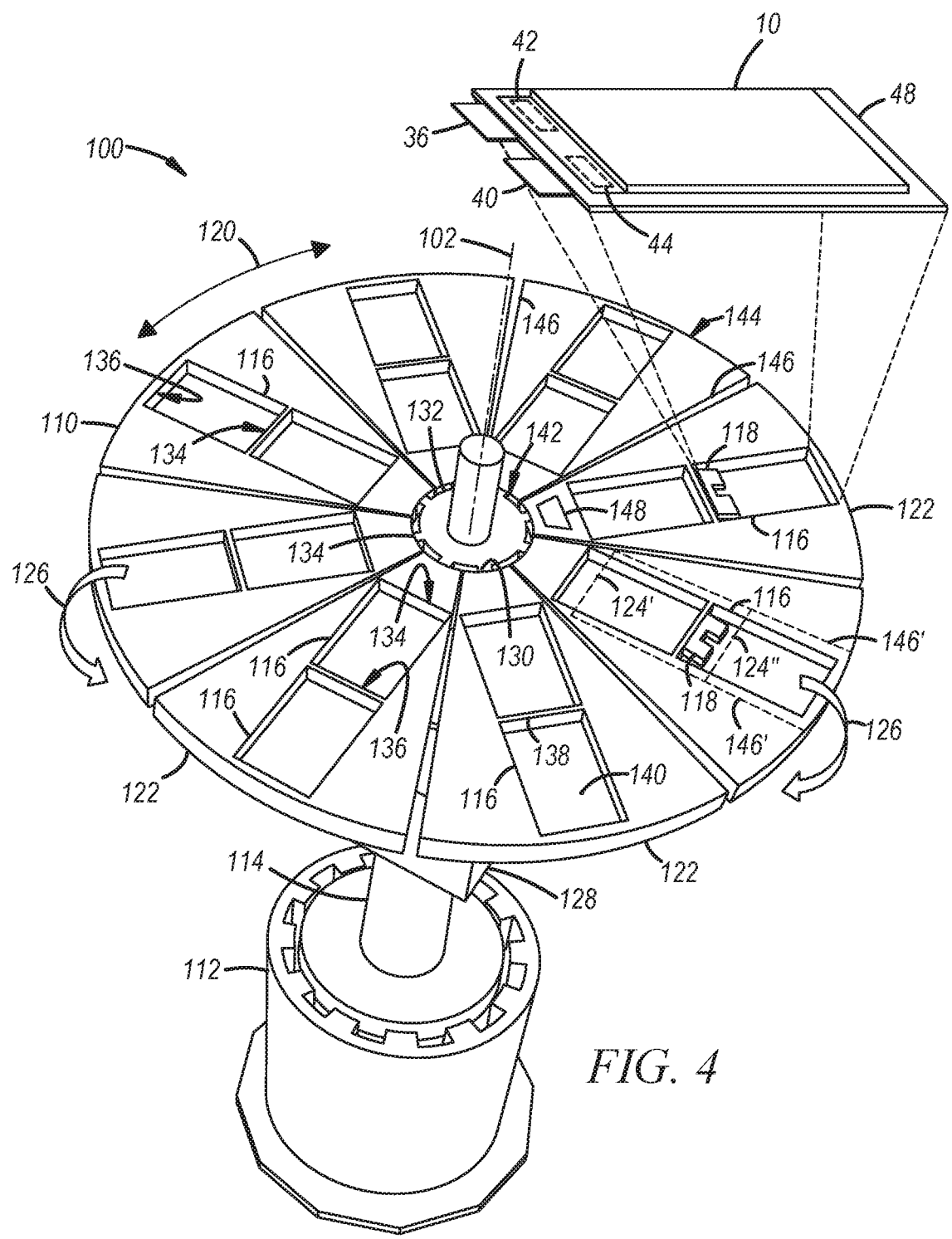
FIG. 4 is a perspective view of an apparatus for simultaneously evaluating electrical connections within a plurality of pouch-type lithium ion battery cells, in accordance with one aspect of the present disclosure.

FIG. 4 illustrates an apparatus 100 for assessing or evaluating the integrity of a battery cell 10, in accordance with one aspect of the present disclosure. The apparatus 100 may be used to evaluate the integrity of a solid electrical and mechanical joint 42, 44 sealed within an enclosure 46 of a battery cell 10 More specifically, the apparatus 100 is configured to assess the integrity of a solid electrical and mechanical joint 42, 44 formed between one or more electrically conductive components 22, 28 hermetically sealed within an outer casing 48 of a battery cell 10 and an electrically conductive terminal 36, 40 having a proximal end that extends inside the enclosure 36 of the cell 10 and a distal end that extends outside the enclosure 46 and outside of the casing 48.

The apparatus 100 includes a circular platform 110 having a central axis 102, a pedestal 112, and a shaft 114 extending from the pedestal 112. The circular platform 110 is supported for rotation about the central axis 102 by the vertical shaft 114. In one form, the vertical shaft 114 may extend through a central opening 130 in the circular platform 110 and may be coupled thereto by a hub 132.

The circular platform 110 includes a plurality of slots 116 in which a plurality of battery cells 10 may be received for evaluating the integrity of the cells 10. Each of the slots 116 includes a first end 134 oriented toward the central opening 130 of the platform 110 and an opposite second end 136 oriented away from the central opening 130, toward the outer circumference of the platform 110. Each of the slots 116 may be formed as a recess in the circular platform 110 and may be defined by a base wall 138 and one or more sidewalls 140. In the embodiment depicted in FIG. 4, the circular platform 110 includes a group of eight (8) radially inner circumferentially spaced-apart slots 116 and a group of eight (8) radially outer circumferentially spaced-apart slots 116; however, other arrangements are certainly possible. For example, in other embodiments, the platform 110 may include a single group of circumferentially spaced-apart slots 116, with each of the slots 116 positioned at the same radial distance as the other slots 116 on the platform 110.

A terminal clamp 118 may be located adjacent the first end 134 of each of the slots 116 for securing a battery cell 10 therein and/or for establishing an electrical connection between the positive and negative terminals 36, 40. Each of the terminal clamps 118 may secure a battery cell 10 within one of the slots 116 by applying a holding force to one or both of the positive and negative terminals 36, 40 of the cell 10. Additionally or alternatively, each of the terminal clamps 118 may secure a battery cell 10 within one of the slots 116 by applying a holding force to an exterior surface of the outer casing 48 of the battery cell 10. The clamp 118 may be configured to provide an electrical connection between the positive and negative terminals 36, 40 and a battery cell impedance measuring device (not shown) for monitoring the impedance of the cell 10 during operation of the apparatus 100. In one form, the clamp 118 may be configured to provide an electrical connection between the positive and negative terminals 36, 40 without imparting a holding force to the terminals 36, 40 and/or the outer casing 48 of the battery cell 10. In such case, a battery cell 10 may be secured within one of the slots 116 by other means, for example, by suitable configuration of the base wall 138 and/or the sidewalls 140 of the slot 116.

After one or more battery cells 10 are suitably positioned within the slots 116, the circular platform 110 may be rotated in a clockwise or counterclockwise direction 120. During rotation of the platform 110, the battery cells 10 experience a centrifugal force in a radially outward direction relative to the platform 110. As a result of this centrifugal force, the positive and negative terminals 36, 40 (and the solid joints 42, 44 formed between the tabs 26, 32 and the terminals 36, 40) of each of the cells 10 will experience a pulling force in a longitudinal direction relative to the cell 10 and in a radially outward direction relative to the platform 110. The clamp 118 may provide an electrical connection between the positive and negative terminals 36, 40 of the cell 10 and the impedance measuring device so that the impedance of the cell 10 can be monitored while the positive and negative terminals 36, 40 (and the solid joints 42, 44) are subjected to the pulling force. Because the pulling force applied to the cells 10 during operation of the apparatus 100 results from the rotational motion of the platform 110, the pulling force can be imparted to a plurality of positive and negative terminals 36, 40 (and solid joints 42, 44) enclosed within a plurality of battery cells 10 while monitoring the impedance thereof, without imparting a compressive force to the outer casings 48 of the cells 10 or to the electrochemical cell components enclosed therein. Thereafter, the battery cell impedance measurements can be analyzed to assess the integrity of the battery cells 10 (including the solid joints 42, 44) without destroying or adversely impacting the functionality of the battery cell 10.

In one form, the circular platform 110 may comprise a plurality of discrete circumferentially spaced-apart radially extending segments 122. Each of the segments 122 may include a first end 142 at or adjacent to the central opening 130 of the platform 110, an opposite second end 144 at or adjacent to the outer circumference of the platform 110, and a pair of sidewalls 146 that extend between the first and second ends 142, 144 thereof. As shown in FIG. 4, all of the segments 122 initially may be aligned along a horizontal plane, but may be configured to pivot relative to a radially inner pivot axis 124 in a direction 126 above or below the initial horizontal plane. In particular, during rotation of the platform 110, one or more of the segments 122 may be controlled to pivot relative to the pivot axis 124 above or below the horizontal plane to increase the magnitude of the pulling force imparted to the positive and negative terminals 36, 40 (and the solid joints 42, 44) and/or to impart a bending force to the positive and negative terminals 36, 40 (and the solid joints 42, 44) of the cell 10. At the same time, the clamp 118 may provide an electrical connection between the positive and negative terminals 36, 40 of the cell 10 and the battery cell impedance measuring device so that the impedance of the cell 10 can be monitored while the positive and negative terminals 36, 40 (and the solid joints 42, 44) are subjected to the pulling force and/or the bending force. Additionally or alternatively, the second ends 144 of the segments 122 may be configured to pivot relative to the first ends 142 of the segments 122 along one or more intermediate pivot axes 124', 124" disposed between the central opening 130 and the outer circumference of the platform 110. In one form, the intermediate pivot axes 124', 124" may be arranged below the location of the solid joints 42, 44 sealed within the outer casings 48 of the battery cells 10 to impart a targeted bending force to the positive and negative terminals 36, 40 of the cells 10 at the locations of the solid joints 42, 44.

In the embodiment depicted in FIG. 4, the segments 122 are generally pie-shaped and gradually increase in width from the first ends 142 to the second ends 144 thereof. However, in other embodiments, the width of the segments 122 may be substantially the same at the first and second ends 142, 144 of the segments 122. For example, in one form, a pair of substantially parallel sidewalls 146' may extend between the first and second ends 142, 144 of each of the slots 116. Forming the segments 122 with substantially parallel sidewalls 146' may allow adjacent segments 122 to pivot above or below the horizontal plane at the same time without contacting one another.

In the embodiment depicted in FIG. 4, each of the segments 122 includes two radially spaced-apart slots 116, and, during rotation of the platform 110, the cells 10 located within the radially outer slots 116 will experience a greater centrifugal force than the cells 10 located within the radially inner slots 116. However, in other embodiments, each of the segments 112 may include a single slot 116. In addition, in one form, each of the slots 116 may be positioned at the same radial distance as the other slots 116 on the platform 110 so that all of the cells 10 located within the slots 116 will experience the same centrifugal force during rotation of the platform 110.

In the embodiment depicted in FIG. 4, the apparatus 100 includes a single circular platform 110. However, in other embodiments, the apparatus 100 may include multiple circular platforms 110 stacked relative to one another along the vertical shaft 114.

Rotational movement may be transmitted to the platform 110 via a clutch 128 coupled to the shaft 114. A generator (not shown) may be associated with the platform 110 for supplying power to the battery cell impedance measuring device and/or to any other electric components of the apparatus 100.

In addition to monitoring the impedance of the cells 10, the apparatus 100 also may include an imaging device 148 for taking non-destructive measurements and/or performing a non-destructive physical evaluation of the cells 10 (including the terminals 36, 40 and/or the solid joints 42, 44 formed between the tabs 26, 32 and the terminals 36, 40) before, during, or after rotation of the platform 110. In particular, the physical properties and relative location, as well as the thermal characteristics of the cells 10 and their components may change before, during, or after rotation of the platform 110 and the imaging device 148 may be configured to monitoring and measure these changes for the purpose of assessing the integrity of the cells 10. For example, the imaging device 148 may be configured to record an image of the cells 10 (including the terminals 36, 40 and/or the solid joints 42, 44) before and after rotation of the platform 110 for comparison so that a state of change can be detected and measured. The imaging device 148 may be carried by the platform 110, the shaft 114, or another component of the apparatus 100. In one form, the imaging device 148 may comprise a laser detection head for conducting stationary laser ultrasonic inspection and/or imaging of the cells 10 prior to, during, or after rotation of the platform 110. The laser detection head may be mounted to a stationary component of the apparatus 100. In other embodiments, the imaging device 148 may be configured to detect and/or measure a state of change for the purpose of assessing the integrity of the cells 10 using one or more of the following techniques: laser imaging, laser shearography, optical imaging, x-ray imaging, infrared imaging (e.g., thermography), acoustic emission testing, 3D laser scanning, and optical coherence tomography. In one form, the imaging device 148 may comprise a linear variable displacement transformer (LVTD) configured to measure the linear displacement of the cells 10 and/or their components before, during, or after rotation of the platform 110.

Figure 5:
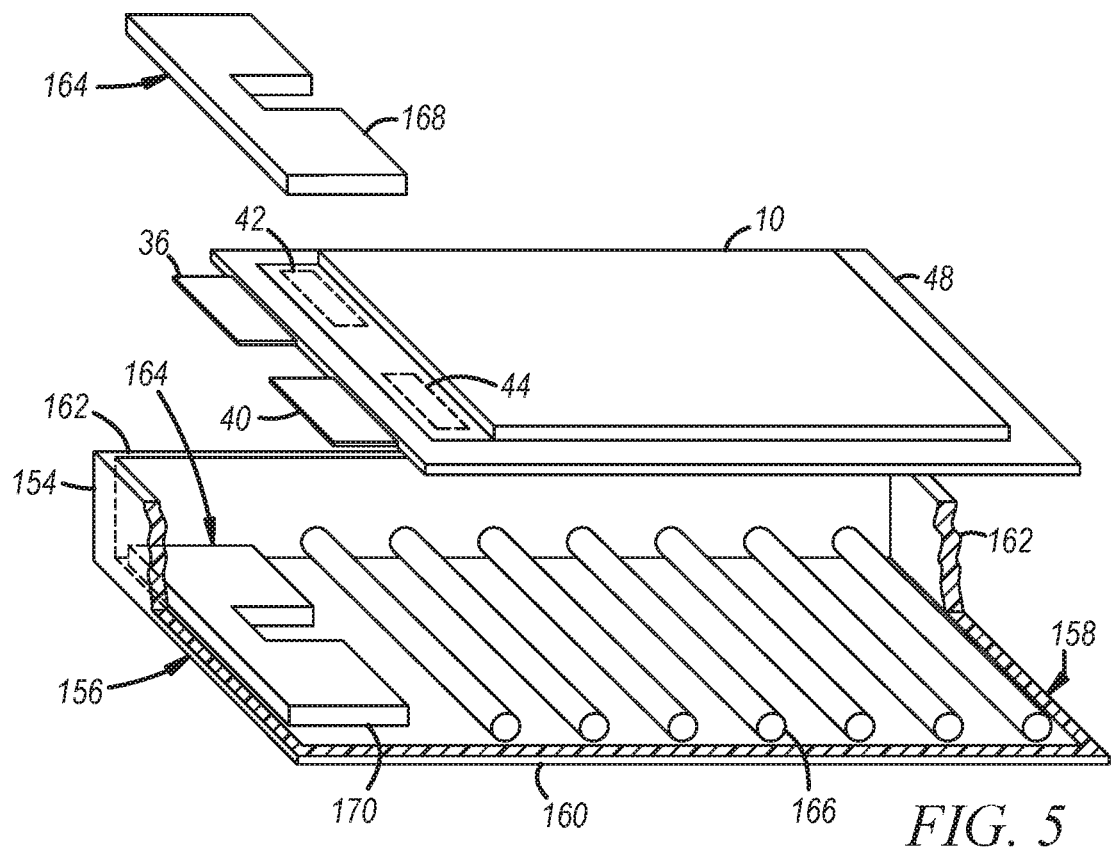
FIG. 5 is an exploded perspective view of a container in which a pouch-type lithium ion battery cell is held during operation of the apparatus of FIG. 4, in accordance with one aspect of the present disclosure.

Referring now to FIG. 5, the apparatus 100 may include trays 154 for accurately locating and effectively securing each of the cells 10 within the slots 116. Each of the trays 154 is sized to fit within one of the slots 116 and may be configured to be removable therefrom. As shown, each of the trays 154 may include a first end 156, an opposite second end 158, a base wall 160, one or more sidewalls 162, a terminal clamp 164, and a plurality of rollers 166. The trays 154 may be inserted into the slots 116 such that the first end 156 of each tray 154 is oriented toward the central opening 130 of the platform 110 and the second end 158 of each tray 154 is oriented away from the central opening 130, toward the outer circumference of the platform 110. In one form, the tray 154 may include two longitudinally extending sidewalls 162, which may restrict lateral movement of the cell 10 in the slot 116 during rotation of the platform 110.

The terminal clamp 164 is located adjacent the first end 156 of the tray 154 and is configured to apply a holding force to one or both of the positive and negative terminals 36, 40 of the cell 10 to retain the cell 10 within the tray 154 and to electrically connect the positive and/or negative terminals 36, 40 to the battery cell impedance measuring device. In one form, the clamp 164 may comprise an upper jaw 168 and a lower jaw 170 that are configured to come together after the cell 10 is placed within the tray 154 to clamp the positive and/or negative terminals 36, 40 therebetween.

The cell 10 may be supported within the tray 154 on the rollers 166 so that the cell 10 can move in a radially outward direction within the slot 116 during rotation of the platform 110. Alternatively, the rollers 166 may be located within the slot 116 and the tray 154 may be inserted into the slot 116 above the rollers 166 so that the tray 154 is supported within the slot 116 by the rollers 166. In such case, the rollers 166 may allow the tray 154 and the cell 10 to move in a radially outward direction within the slot 116 during rotation of the platform 110. In other embodiments, the cell 10 may be supported within the tray 154 by a pressurized air cushion (not shown).

Figure 6:
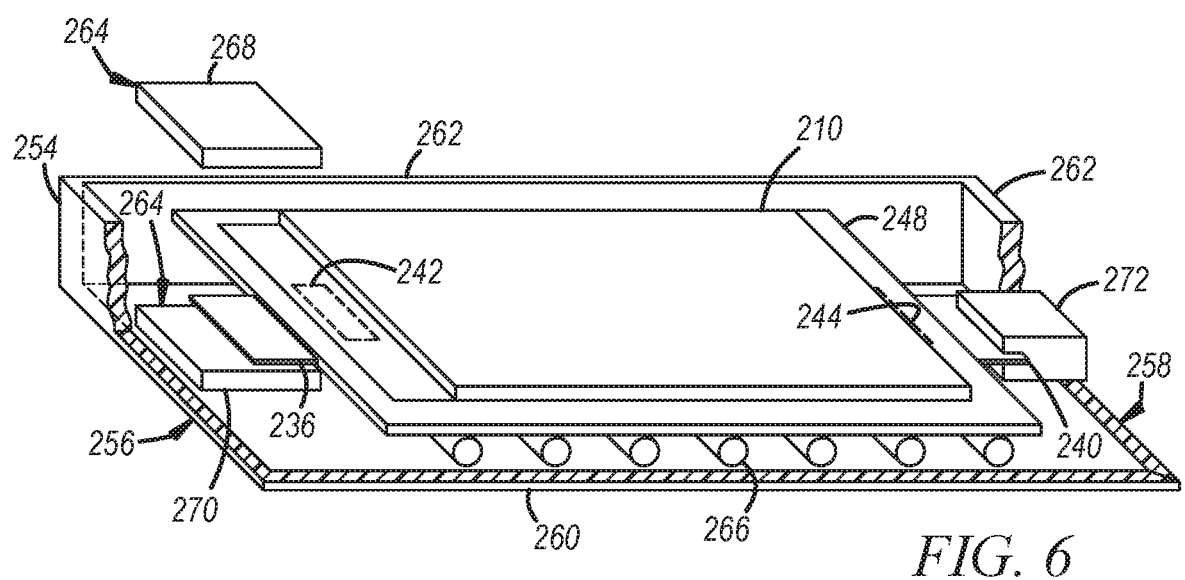
FIG. 6 is an exploded perspective view of another container in which a pouch-type lithium ion battery cell is held during operation of the apparatus of FIG. 4, in accordance with another aspect of the present disclosure.

Referring now to FIG. 6, which depicts another embodiment of a tray 254 for accurately locating and effectively securing a pouch type battery cell 210 within one of the slots 116 on the platform 110. The battery cell 210 is similar in many respects to the battery cell 10 depicted in FIGS. 3-5, and a description of common subject matter generally may not be repeated here. As shown in FIG. 6, in this embodiment, the battery cell 210 comprises an outer casing 248 having positive and negative terminals 236, 240 extending in opposite longitudinal directions from opposite first and second ends of the casing 248. Like the embodiment depicted in FIGS. 3, 4, and 5, each of the positive and negative terminals 236, 240 has a proximal end enclosed within an enclosure (not shown) defined by the outer casing 248 and a distal end that extends outside of the enclosure, beyond a periphery of the casing 248. In addition, within the outer casing 248, a solid joint 242 is formed between uncoated tabs of positive electrode current collectors (not shown) and the proximal end of the positive terminal 236, and a solid joint 244 is formed between uncoated tabs of negative electrode current collectors (not shown) and the proximal end of the negative terminal 240. However, in this embodiment, the solid joints 242, 244 are located within the casing 248 on opposite first and second ends of the casing 248, instead of being located adjacent to each other like the embodiment depicted in FIGS. 3-5.

The tray 254 is sized to fit within one of the slots 116 and may be configured to be removable therefrom. As shown, the tray 254 may include a first end 256, an opposite second end 258, a base wall 260, one or more sidewalls 262, a terminal clamp 264, and a plurality of rollers 266. The tray 254 may be inserted into the slot 116 such that the first end 256 of the tray 254 is oriented toward the central opening 130 of the platform 110 and the second end 258 of the tray 254 is oriented away from the central opening 130, toward the outer circumference of the platform 110. In one form, the tray 254 may include two longitudinally extending sidewalls 262, which may restrict lateral movement of the cell 210 in the slot 116 during rotation of the platform 110.

The terminal clamp 264 is located adjacent the first end 256 of the tray 254 and is configured to apply a holding force to the terminal 236, 240 of the cell 210 that is also located adjacent the first end 256 of the tray 254. In the embodiment depicted in FIG. 6, the terminal clamp 264 is configured to apply a holding force to the positive terminal 236; in other embodiments, the orientation of the cell 210 may be reversed and the terminal clamp 264 may be configured to apply a holding force to the negative terminal 240. The clamp 264 is configured to retain the cell 210 within the tray 254 and to electrically connect the positive terminal 236 (or the negative terminal 240) to the impedance measuring device (depending on the orientation of the cell 210 within the tray 254). The integrity of the solid joints 242, 244 sealed within the casing 248 may be assessed by monitoring the impedance of the cell 210, as measured across the exposed distal ends of the positive and negative terminals 236, 240 of the cell 210. In one form, the clamp 264 may comprise an upper jaw 268 and a lower jaw 270 that are configured to come together after the cell 210 is placed within the tray 254 to clamp the positive terminal 236 (or the negative terminal 240) therebetween. In the embodiment shown in FIG. 6, the cell 210 is arranged within the tray 254 such that the positive terminal 236 is located adjacent the first end 256 of the tray 254 and can be clamped between the upper and lower jaws 268, 270 of the clamp 264 during operation of the apparatus 100. During rotation of the platform 110, the cell 210 is subjected to a centrifugal force. As a result of the centrifugal force applied to the cell 210, the positive terminal 236 (or the negative terminal 240) will experience a pulling force in a longitudinal direction relative to the cell 210 and in a radially outward direction relative to the platform 110.

The cell 210 may be supported within the tray 254 on the rollers 266 so that the cell 210 can move in a radially outward direction within the slot 116 during rotation of the platform 110. Alternatively, the rollers 266 may be located within the slot 116 and the tray 254 may be inserted into the slot 116 above the rollers 266 so that the tray 254 is supported within the slot 116 by the rollers 266. In such case, the rollers 266 may allow the tray 254 and the cell 210 to move in a radially outward direction within the slot 116 during rotation of the platform 110. In other embodiments, the cell 210 may be supported within the tray 254 by a pressurized air cushion (not shown).

A weight 272 may be coupled to the end of the cell 210 located adjacent to the second end 258 of the tray 254. For example, the weight 272 may be coupled to the terminal 236, 240 that is located adjacent the second end 258 of the tray 254. In the embodiment shown in FIG. 6, the cell 210 is arranged within the tray 254 such that the negative terminal 240 is located adjacent the second end 258 of the tray 254 and the weight 272 is coupled to the distal end of the negative terminal 240. Coupling the weight 272 to the distal end of the negative terminal 240 will increase the magnitude of the pulling force imparted to the positive terminal 236 during rotation of the platform 110 and will effectively impart a pulling force to the negative terminal 240 during rotation of the platform 110. The weight 272 also may be configured to establish an electrical connection between the positive terminal 236 (or the negative terminal 240) of the cell 210 and the impedance measuring device so that the impedance of the cell 210 can be monitored during rotation of the platform 110. In other embodiments, for example, where both the positive and negative terminals 236, 240 extend from the same end of the casing 248, the positive and negative terminals 236, 240 may be located adjacent the first end 256 of the tray 254 and clamped between the upper and lower jaws 268, 270 of the terminal clamp 264 and the weight 272 may be coupled to the opposite end of the casing 248, adjacent the second end 258 of the tray 254. Coupling the weight 272 to the end of the casing 248 located adjacent the second end 258 of the tray 254 will increase the magnitude of the pulling force imparted to the positive and negative terminals 236, 240 during rotation of the platform 110, without increasing the rotational velocity of the platform 110.

Figure 7:
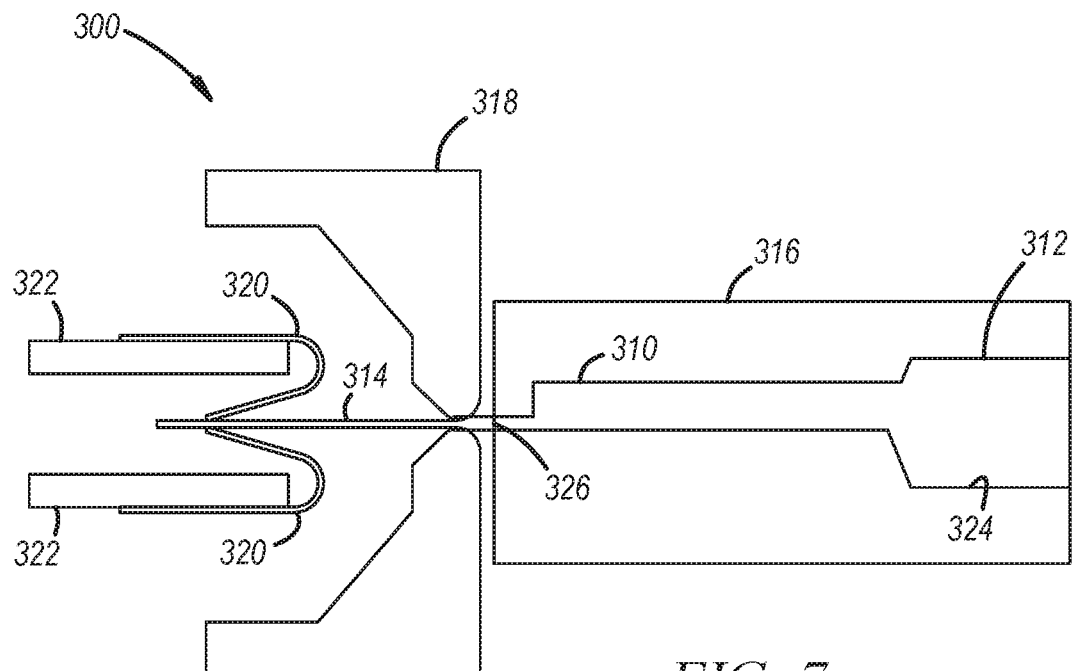
FIGS. 7-8 are schematic side views of an apparatus for evaluating electrical connections within a pouch-type lithium ion battery cell, in accordance with one aspect of the present disclosure.
Figure 8:
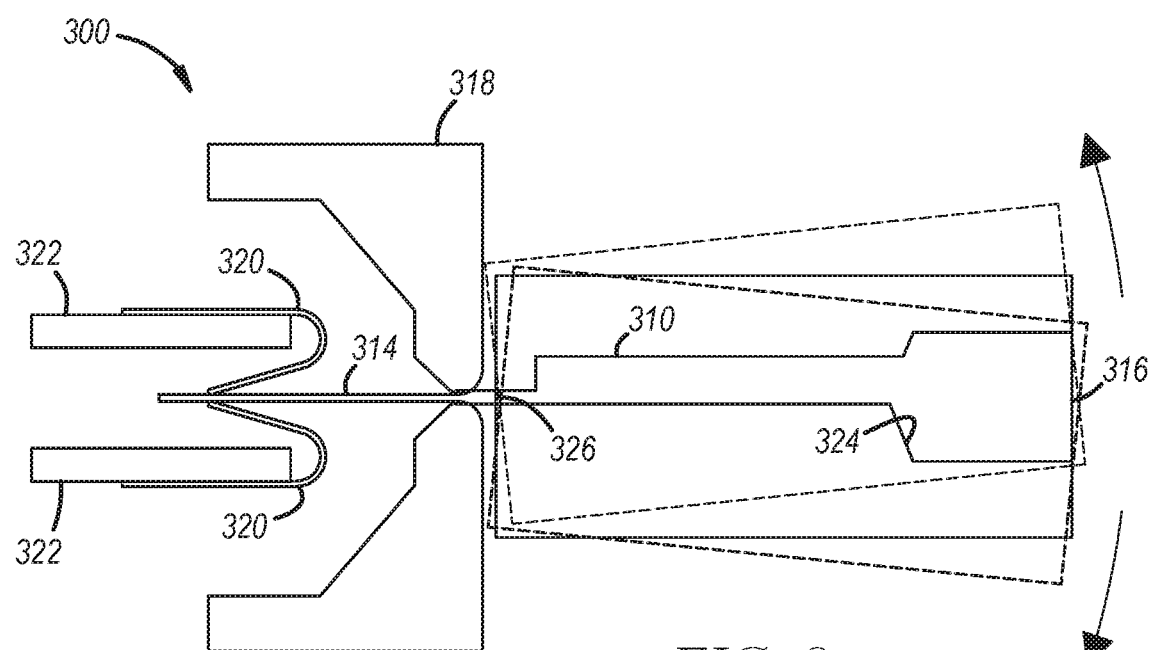

FIGS. 7 and 8 illustrate an apparatus 300 for assessing or evaluating the integrity of a battery cell 310, in accordance with another aspect of the present disclosure. The battery cell 310 may be similar in many respects to the battery cells 10, 210 depicted in FIGS. 3-6, and a description of common subject matter generally may not be repeated here. The apparatus 300 may be used to evaluate the integrity of a solid electrical and mechanical joint (not shown) sealed within an enclosure (not shown) defined by an outer casing 312 of the battery cell 310. More specifically, the apparatus 300 is configured to assess the integrity of a solid electrical and mechanical joint formed between one or more electrically conductive electrochemical cell components (not shown) hermetically sealed within the outer casing 312 of the battery cell 310 and an electrically conductive positive or negative terminal 314 having a proximal end that extends inside the casing 312 of the battery cell 310 and a distal end that extends outside the casing 312. For example, the terminal 314 may be electrically and mechanically joined to one or more positive or negative current collector tabs (not shown) sealed within the enclosure defined by the outer casing 312 of the battery cell 310. Like the battery cell 10 depicted in FIGS. 3-5, the battery cell 310 may include adjacent positive and negative terminals located at one end of the outer casing 312, or, like the battery cell 210 depicted in FIG. 6, the battery cell 310 may include positive and negative terminals located at opposite ends of the outer casing 312.

The apparatus 300 includes a battery cell holder 316, a vice 318, and a pair of electrically conductive tangs 320 supported by a pair of arms 322. The tangs 320 are configured to electrically connect the terminal 314 to a battery cell impedance measuring device (not shown) so that the impedance of the cell 310 can be monitored while the terminal 314 (and the solid joint formed between the proximal end of the terminal and the current collector tabs) are subjected to a bending force. The tangs 320 may be configured to establish an electrical connection with the distal end of the terminal 314 while imparting a minimal amount of compressive force to the terminal 314 so that the tangs 320 do not restrict or interfere with the movement of the terminal 314. The vice 318 is configured to hold the terminal in a stationary position during operation of the apparatus 300. The vice 318 may be configured to hold the terminal 314 at an intermediate location between the distal end and the proximal end of the terminal 314. As shown in FIGS. 7 and 8, the vice 318 may be configured to hold the terminal 314 at or adjacent to a periphery of the outer casing 312 at a proximal end of the outer casing 312, at a location where the terminal 314 emerges from the proximal end of the outer casing 312. In one form, the vice 318 may be configured to hold the terminal 314 at the location of a hermetic seal formed by the casing 312 around a periphery of the outer casing 312 and around the electrochemical cell components enclosed within the battery cell 310.

The holder 316 defines a chamber 324 in which at least a distal end of the outer casing 312 of the battery cell 310 is received and is configured to hold the distal end of the outer casing 312 within the chamber 324 such that the outer casing 312 initially extends in a horizontal plane. As shown in FIG. 8, during operation of the apparatus 300, the holder 316 is configured to pivot about a pivot axis 326 such that at least the distal end of the outer casing 312 of the battery cell 310 moves above and/or below the initial horizontal plane. Moving the distal end of the outer casing 312 of the cell 310 above and/or below the initial horizontal plane while the terminal 314 (and optionally a periphery of the outer casing 312 at the proximal end of the outer casing 312) is/are held in a stationary position by the vice 318 effectively imparts a bending force to the proximal end of the terminal and to the solid joint formed between the proximal end of the terminal 314 and the current collector tabs enclosed within the outer casing 312. As such, the apparatus 300 can be used to assess the integrity of the cell 310 by monitoring the impedance of the cell 310 while the terminal 314 (and the solid joint formed between the proximal end of the terminal 314 and the current collector tabs) are subjected to the bending force.

Figure 9:
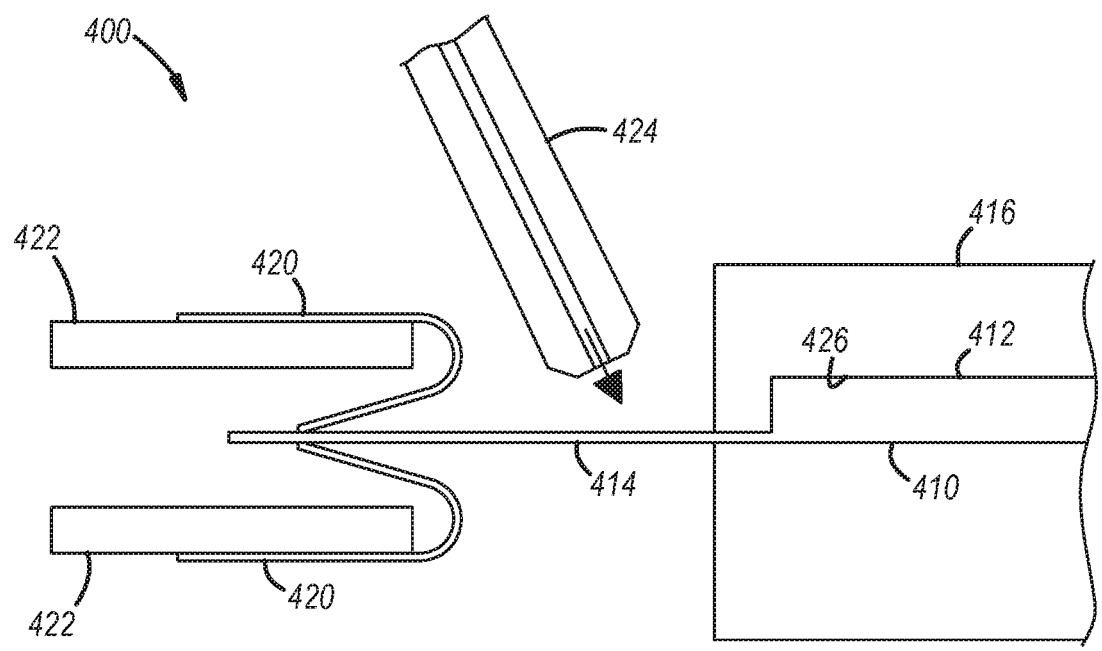
FIGS. 9-10 are schematic side views of an apparatus for evaluating electrical connections within a pouch-type lithium ion battery cell, in accordance with another aspect of the present disclosure.
Figure 10:
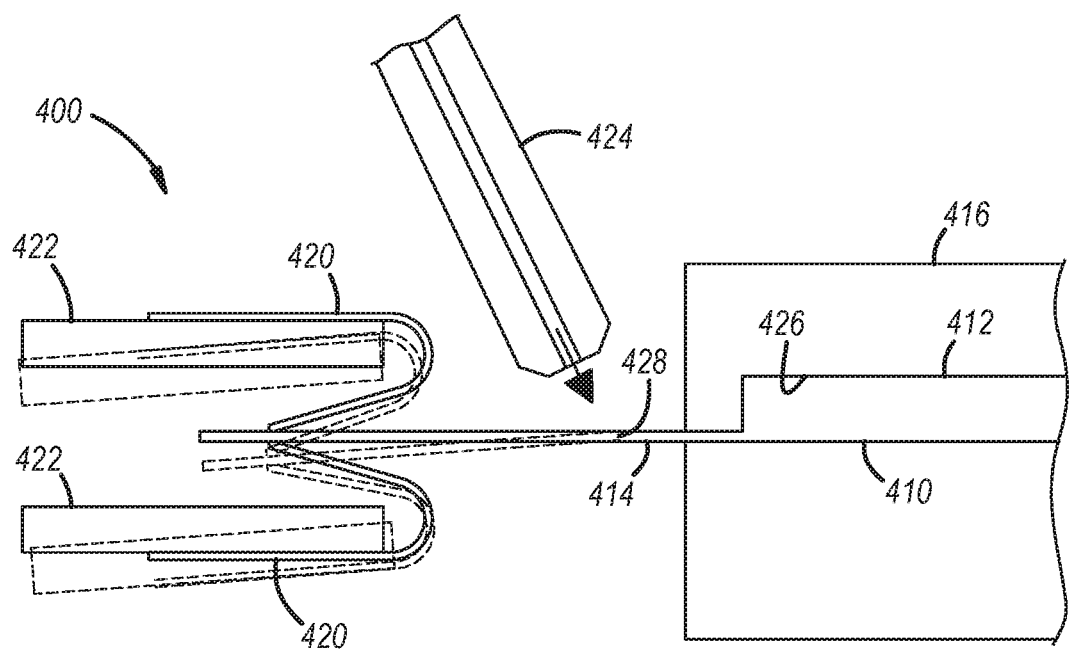

FIGS. 9 and 10 illustrate an apparatus 400 for assessing or evaluating the integrity of a battery cell 410, in accordance with yet another aspect of the present disclosure. The battery cell 410 may be similar in many respects to the battery cells 10, 210 depicted in FIGS. 3-6, and a description of common subject matter generally may not be repeated here. The apparatus 400 may be used to evaluate the integrity of a solid electrical and mechanical joint (not shown) sealed within an enclosure (not shown) defined by an outer casing 412 of the battery cell 410. More specifically, the apparatus 400 is configured to assess the integrity of a solid electrical and mechanical joint formed between one or more electrically conductive electrochemical cell components (not shown) hermetically sealed within the outer casing 412 of the battery cell 410 and an electrically conductive positive or negative terminal 414 having a proximal end that extends inside the casing 412 of the battery cell 410 and a distal end that extends outside the casing 412. For example, the terminal 414 may be electrically and mechanically joined to one or more positive or negative current collector tabs (not shown) sealed within the enclosure defined by the outer casing 412 of the battery cell 410. Like the battery cell 10 depicted in FIGS. 3-5, the battery cell 410 may include adjacent positive and negative terminals located at one end of the outer casing 412, or, like the battery cell 210 depicted in FIG. 6, the battery cell 410 may include positive and negative terminals located at opposite ends of the outer casing 412.

The apparatus 400 includes a battery cell holder 416, a pair of electrically conductive tangs 420 supported by a pair of arms 422, and a source of pressurized gas 424. The holder 416 defines a chamber 426 in which at least a distal end of the outer casing 412 of the battery cell 410 is received and is configured to hold the distal end of the outer casing 412 of the battery cell 410 in a stationary position within the chamber 426 such that the outer casing 412 extends in a horizontal plane during operation of the apparatus 400. The tangs 420 are configured to electrically connect the terminal 414 to a battery cell impedance measuring device (not shown) so that the impedance of the cell 410 can be monitored while the terminal 414 (and the solid joint formed between the proximal end of the terminal 414 and the current collector tabs) are subjected to a bending force. The tangs 420 may be configured to establish an electrical connection with the terminal 414 while imparting a minimal amount of compressive force to the terminal 414. The arms 422 may provide the tangs 420 with flexibility of movement.

As shown in FIG. 10, the source of pressurized gas 424 may comprise a nozzle and/or a venture valve that is configured to direct a pulse or a continuous flow of pressurized gas (e.g., air) at the terminal 414 during operation of the apparatus 400 such that the distal end of the terminal 414 pivots about a pivot axis 428 and moves above and/or below the horizontal plane defined by the stationary outer casing 412 of the battery cell 410. The source of pressurized gas 424 may be configured to direct a pulse or a continuous flow of pressurized gas at the distal end of the terminal 414 or at an intermediate location between the distal end and the proximal end of the terminal 414. For example, the source of pressurized gas 424 may be configured to direct a pulse or a continuous flow of pressurized gas at or adjacent to a periphery of the outer casing 412 at a proximal end of the outer casing 412, at a location where the terminal 414 emerges from the proximal end of the outer casing 412. In one form, the source of pressurized gas 424 may be configured to direct a pulse or a continuous flow of pressurized gas at the location of a hermetic seal formed by the casing 412 around a periphery of the outer casing 412 and around the electrochemical cell components enclosed within the battery cell 410.

Moving the distal end of the terminal 414 (and optionally a periphery of the outer casing 412 at the proximal end of the outer casing 412) above and/or below the horizontal plane defined by the outer casing 412 of the battery cell 410 while the distal end of the outer casing 412 of the cell 410 is held in a stationary position by the holder 416 effectively imparts a bending force to the terminal 414 and to the solid joint formed between the terminal 414 and the current collector tabs enclosed within the outer casing 412. At the same time, the flexibility of the arms 422 allows the tangs 420 to move with the distal end of the terminal 414 and thereby maintain an electrical connection with the terminal 414 so that the impedance of the cell 410 can be continuously monitored during operation of the apparatus 400.

Figure 11:
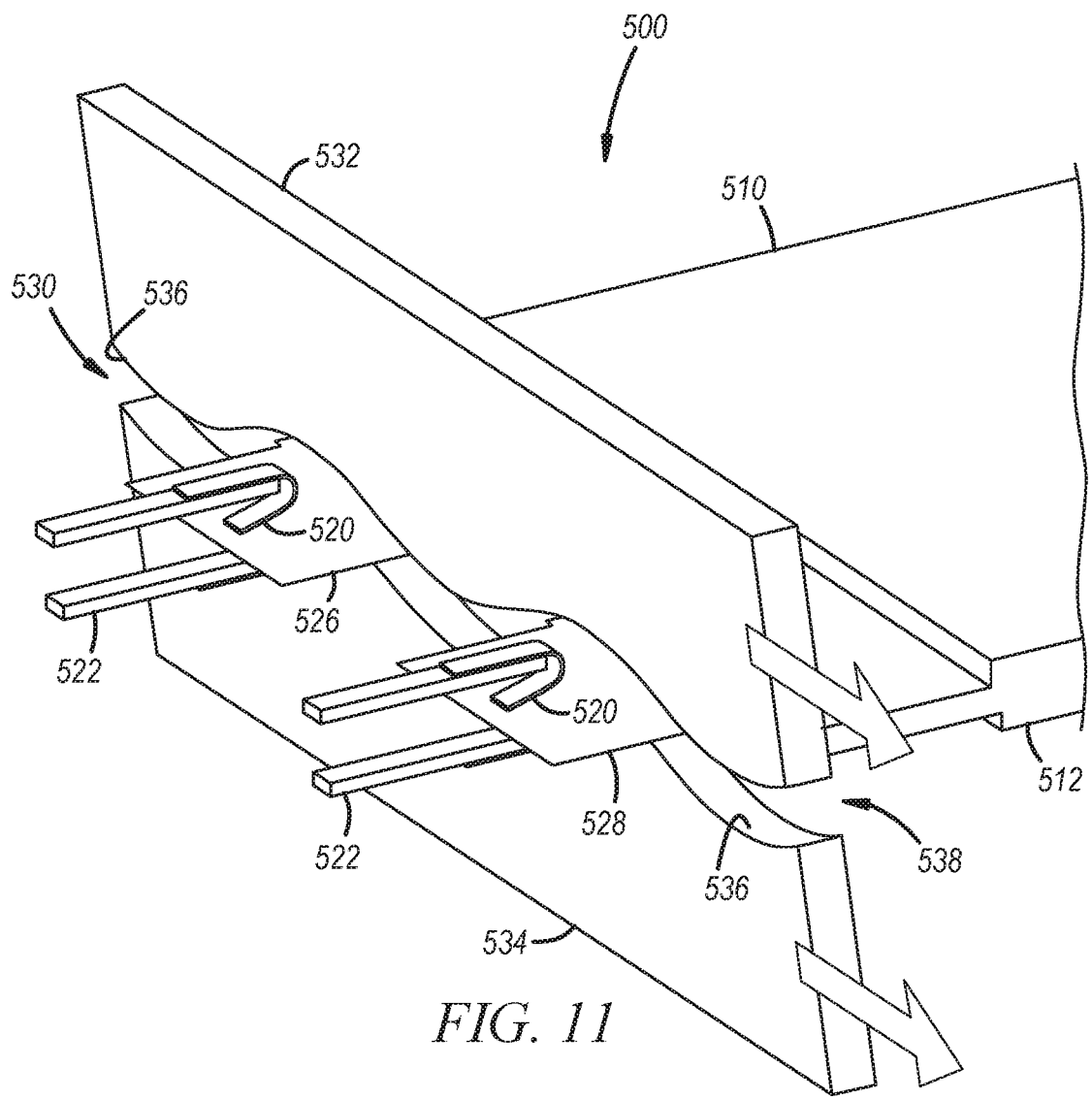
FIG. 11 is a schematic perspective view of an apparatus for evaluating electrical connections within a pouch-type lithium ion battery cell, in accordance with yet another aspect of the present disclosure.

FIG. 11 illustrates an apparatus 500 for assessing or evaluating the integrity of a battery cell 510, in accordance with another aspect of the present disclosure. The battery cell 510 may be similar in many respects to the battery cells 10, 210 depicted in FIGS. 3-6, and a description of common subject matter generally may not be repeated here. The apparatus 500 may be used to evaluate the integrity of one or more solid electrical and mechanical joints (not shown) sealed within an enclosure (not shown) defined by an outer casing 512 of the battery cell 510. More specifically, the apparatus 500 is configured to assess the integrity of solid electrical and mechanical joints (not shown) formed between electrically conductive components (not shown) hermetically sealed within the outer casing 512 of the battery cell 510 and a pair of electrically conductive positive and negative terminals 526, 528 having proximal ends that extend inside the outer casing 512 of the cell 510 and distal ends that extend outside the outer casing 512. In one form, the terminals 526, 528 may be electrically and mechanically joined to respective positive and negative current collector tabs (not shown) sealed within the outer casing 512 of the battery cell 510.

The apparatus 500 includes two pairs of electrically conductive tangs 520 supported by pairs of arms 522 and an oscillator 530. The tangs 520 are configured to establish electrical connections with the terminals 526, 528 while imparting a minimal amount of compressive force to the terminals 526, 528. The arms 522 are configured to provide the tangs 520 with flexibility of movement. The oscillator 530 includes an upper plate 532 and a lower plate 534 having complementary facing surfaces 536 that define a gap 538 therebetween. The gap 538 exhibits an oscillating or sinusoidal side profile and is sized to receive the distal ends of the terminals 526, 528 therein. During operation of the apparatus 500, the plates 532, 534 of the oscillator 530 move in tandem in a latitudinal (or width) direction of the outer casing 512 of the cell 510. At the same time, the distal ends of the terminals 526, 528 repeatedly move up and down in response to the movement of the plates 532, 534 in a transverse direction perpendicular to a plane defined by the lateral direction and a longitudinal (or length) direction of the outer casing 512 of the cell 510. In one form, the gap 538 may be sized to receive the distal ends of the terminals 526, 528 and a peripheral portion of the outer casing 512 adjacent to the distal ends of the terminals 526, 528. As such, during operation of the apparatus 500, the distal ends of the terminals 526, 528 and the peripheral portion of the outer casing 512 adjacent the distal ends of the terminals 526, 528 repeatedly move up and down in response to the movement of the plates 532, 534 in the transverse direction.

Moving the distal ends of the terminals 526, 528 (and optionally the peripheral portion of the outer casing 512 adjacent the distal ends of the terminals 526, 528) up and down in the transverse direction while the distal end of the outer casing 512 of the cell 510 remains stationary effectively imparts a bending force to the terminals 526, 528 and to the solid joints formed between the terminals 526, 528 and the current collector tabs enclosed within the outer casing 512. At the same time, the flexibility of the arms 522 allows the tangs 520 to move with the distal ends of the terminals 526, 528 and thereby maintain an electrical connection with the terminals 526, 528 so that the impedance of the cell 510 can be continuously monitored during operation of the apparatus 500.

One or both of the trays 154, 254 depicted in FIGS. 5 and 6 and/or one or all of the apparatuses 300, 400, 500 depicted in FIGS. 7-11 may be incorporated into the apparatus 100 depicted in FIG. 4 as desired.

The above description of preferred exemplary embodiments, aspects, and specific examples are merely descriptive in nature; they are not intended to limit the scope of the claims that follow. Each of the terms used in the appended claims should be given its ordinary and customary meaning unless specifically and unambiguously stated otherwise in the specification.

What is claimed is:

1. An apparatus for evaluating a battery cell that includes a hermetically sealed outer casing, a plurality of electrically conductive components enclosed within the outer casing, an electrically conductive terminal having a proximal end that extends within the outer casing and a distal end that extends in a longitudinal direction relative to the cell outside the outer casing, and a solid electrical and mechanical joint formed between one or more of the electrically conductive components and the proximal end of the electrically conductive terminal, wherein the solid electrical and mechanical joint is entirely enclosed within the outer casing of the battery cell, the apparatus comprising:

a circular platform supported for rotation about a central axis;

a plurality of slots circumferentially spaced apart from one another on the circular platform, wherein each of the slots includes a first end oriented toward the central axis of the circular platform and an opposite second end oriented away from the central axis toward an outer circumference of the platform; and a terminal clamp located adjacent the first end of one of the slots for securing the battery cell within the slot such that movement of the distal end of the electrically conductive terminal extending from a first end of the outer casing is restrained, while movement of an opposite second end of the outer casing is unrestrained in the longitudinal direction, wherein, during rotation of the circular platform, the electrically conductive terminal and the solid electrical and mechanical joint experiences a pulling force in the longitudinal direction and in a radially outward direction relative to the central axis of the circular platform.

2. The apparatus set forth in claim 1 wherein the terminal clamp is configured to provide an electrical connection between the distal end of the electrically conductive terminal and a battery cell impedance measuring device.

3. The apparatus set forth in claim 1 wherein movement of the battery cell within the slot is constrained in a lateral direction relative to the cell by a pair of longitudinally extending sidewall s.

4. The apparatus set forth in claim 1 wherein the circular platform includes a plurality of discrete circumferentially spaced-apart radially extending segments, with the plurality of slots being distributed among the radially extending segments of the circular platform, and wherein the radially extending segments of the circular platform are configured to pivot relative to a pivot axis to impart a transverse bending force to the electrically conductive terminals of the battery cells secured within the slots of the radially extending segments.

5. The apparatus set forth in claim 1 including a plurality of rollers disposed within the slots for physically supporting the battery cells within the slots without inhibiting radially outward movement of the battery cells during rotation of the circular platform.

6. The apparatus set forth in claim 1 wherein, when the battery cell includes a first end having a first electrically conductive terminal extending therefrom and an opposite second end having a second electrically conductive terminal extending therefrom, the terminal clamp is configured to retain the battery cell within one of the slots such that the first electrically conductive terminal is oriented toward the central axis of the circular platform and the second electrically conductive terminal is oriented away from the central axis.

7. The apparatus set forth in claim 6 including a weight coupled to the outer casing of the battery cell defined by the second end of the battery cell or to the second electrically conductive terminal of the battery cell.

8. The apparatus set forth in claim 1 wherein each of the plurality of slots is configured to receive (i) a battery cell having positive and negative terminals that both extend from one end of the outer casing, or (ii) a battery cell having a positive terminal that extends from a first end of the outer casing and a negative terminal that extends from an opposite second end of the outer casing.

9. The apparatus set forth in claim 1 wherein the battery cell comprises a lithium ion battery cell.

10. An apparatus for evaluating a battery cell that includes a hermetically sealed outer casing, a plurality of electrically conductive components enclosed within the outer casing, an electrically conductive terminal having a proximal end that extends within the outer casing and a distal end that extends in a longitudinal direction relative to the cell outside the outer casing, and a solid electrical and mechanical joint formed between one or more of the electrically conductive components and the proximal end of the electrically conductive terminal, wherein the solid electrical and mechanical joint is entirely enclosed within the outer casing of the battery cell, the apparatus comprising:
  a battery cell holder defining a chamber in which at least a portion of the outer casing of the battery cell is received;
  a pair of electrically conductive tangs for establishing an electrical connection between the distal end of the electrically conductive terminal and a battery cell impedance measuring device; and
  a means for moving the distal end of the electrically conductive terminal relative to the proximal end of the electrically conductive terminal such that a bending force is applied to electrically conductive terminal and the solid electrical and mechanical joint.

11. The apparatus set forth in claim 10 wherein the battery cell holder is configured to pivot about a pivot axis during operation of the apparatus, and wherein the means for moving the distal end of the electrically conductive terminal relative to the proximal end of the electrically conductive terminal comprises a clamp that holds the distal end of electrically conductive terminal of the battery cell in a stationary position while the battery cell holder pivots about the pivot axis during operation of the apparatus.

12. The apparatus set forth in claim 10 wherein the battery cell holder is configured to hold at least a portion of the outer casing of the battery cell in a stationary position during operation of the apparatus, and wherein the means for moving the distal end of the electrically conductive terminal relative to the proximal end of the electrically conductive terminal comprises a source of pressurized gas that directs a pulse or a continuous flow of pressurized gas at the electrically conductive terminal such that the distal end of the electrically conductive terminal pivots about a pivot axis during operation of the apparatus.

13. The apparatus set forth in claim 10 wherein the battery cell holder is configured to hold at least a portion of the outer casing of the battery cell in a stationary position during operation of the apparatus, and wherein the means for moving the distal end of the electrically conductive terminal relative to the proximal end of the electrically conductive terminal comprises an oscillator that includes an upper plate and a lower plate having complementary facing surfaces that define a gap therebetween wherein the gap is sized to receive the distal end of the electrically conductive terminal and to repeatedly move the distal end of the electrically conductive terminal up and down as the upper and lower plates of the oscillator move in tandem in a lateral direction relative to at least a portion of the outer casing of the battery cell during operation of the apparatus.

14. An apparatus for evaluating a battery cell that includes a hermetically sealed outer casing, a plurality of electrically conductive components enclosed within the outer casing, an electrically conductive terminal having a proximal end that extends within the outer casing and a distal end that extends in a longitudinal direction relative to the cell outside the outer casing, and a solid electrical and mechanical joint formed between one or more of the electrically conductive components and the proximal end of the electrically conductive terminal, wherein the solid electrical and mechanical joint is entirely enclosed within the outer casing of the battery cell, the apparatus comprising:
  a circular platform supported for rotation about a central axis and including a plurality of discrete circumferentially spaced-apart radially extending segments;
  a plurality of slots circumferentially spaced apart from one another on the circular platform, with the plurality of slots being distributed among the radially extending segments of the circular platform, wherein each of the slots includes a first end oriented toward the central axis of the circular platform and an opposite second end oriented away from the central axis toward an outer circumference of the platform; and
  a terminal clamp located adjacent the first end of one of the slots for securing the battery cell within the slot such that movement of the distal end of the electrically conductive terminal extending from a first end of the outer casing is restrained, while movement of an opposite second end of the outer casing is unrestrained in the longitudinal direction,
  wherein, during rotation of the circular platform, the electrically conductive terminal and the solid electrical and mechanical joint experience a pulling force in the longitudinal direction and in a radially outward direction relative to the central axis of the circular platform, and
  wherein the radially extending segments of the circular platform are configured to pivot relative to a pivot axis to impart a transverse bending force to each of the electrically conductive terminals and each of the solid electrical and mechanical joints of the battery cells secured within the slots of the radially extending segments.

* * * * *